United States Patent
Hauenstein et al.

(10) Patent No.: US 6,940,265 B2
(45) Date of Patent: Sep. 6, 2005

(54) DEVICE, AMMETER AND MOTOR VEHICLE

(75) Inventors: M. Henning Hauenstein, Reutlingen (DE); Andreas Stratmann, Gomaringen (DE); Stephan Ernst, Ostfildern (DE); Wolfgang Feiler, Reutlingen (DE); Qu Ning, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/221,008

(22) PCT Filed: Dec. 12, 2001

(86) PCT No.: PCT/DE01/04662

§ 371 (c)(1),
(2), (4) Date: Dec. 31, 2002

(87) PCT Pub. No.: WO02/056032

PCT Pub. Date: Jul. 18, 2002

(65) Prior Publication Data

US 2003/0146744 A1 Aug. 7, 2003

(30) Foreign Application Priority Data

Jan. 9, 2001 (DE) .......................................... 101 00 597

(51) Int. Cl.⁷ .......................... G01R 33/00; G01R 19/00
(52) U.S. Cl. .................................. 324/117 H; 324/127
(58) Field of Search .......................... 324/117 H, 117 R, 324/127, 132; 702/85, 104

(56) References Cited

U.S. PATENT DOCUMENTS 3,323,057 A * 5/1967 Haley ...................... 324/117 R
6,512,359 B1 * 1/2003 Tamai et al. ............ 324/117 R

FOREIGN PATENT DOCUMENTS

| DE | 198 21 492 | 11/1999 |
| DE | 100 43 171 | 4/2001 |
| EP | 0 061 520 | 10/1982 |

* cited by examiner

Primary Examiner—Ernest Karlsen
(74) Attorney, Agent, or Firm—Kenyon & Kenyon

(57) ABSTRACT

A device, an ammeter and a motor vehicle, having a first section and a second section of a conductor for the purpose of measuring the electrical amperage in the conductor are described; a first sensor means and a second sensor means being provided; the current flowing in the first section and in the second section generating a useful magnetic field; the first sensor means being provided to measure the useful magnetic field; the second sensor means being provided in a location where the useful magnetic field disappears; the second sensor means being provided to measure a magnetic interference field; and the measurement of the useful magnetic field being correctable by the measurement of the magnetic interference field.

9 Claims, 2 Drawing Sheets

DEVICE, AMMETER AND MOTOR VEHICLE

BACKGROUND INFORMATION

It is necessary in many situations to precisely detect the amperage in an at least periodically current-carrying conductor. This is done, for example, in automotive engineering to determine electrical parameters of generators and electrical drives while these units are in operation. A contactless, low-loss and potential-free measurement of the electrical current is needed for this purpose.

According to the related art, shunt resistors are currently used to measure currents. Their high power loss and additional self-inductance are undesirable, especially at high amperages. In addition, they do not ensure electrical isolation between the measuring circuit and the main circuit.

Magnetic field sensors, e.g., Hall sensors, lateral magnetotransistors, magnetoresistive resistors, etc., which are able to precisely measure the magnetic field effect of a current-carrying conductor, are also known. The advantage of these sensors lies, in particular, in the electrical isolation between the measuring circuit and the main circuit, the low or even completely non-existent power loss, and the absence of quantities influencing the current to be measured, for example inductive feedback or resistance.

However, a problem with the use of magnetic field sensors to measure current is that interference, i.e., stray, fields of additional current conductors located adjacent to the conductor to be measured exist or are generated by rotating magnetic fields in the vicinity of generators. This makes it difficult to discriminate between the magnetic field to be measured by the magnetic field sensor and parasitic stray fields in the surrounding area.

One known method of avoiding such difficulties is to shield the magnetic field sensor against interfering magnetic fields and to concentrate the magnetic field to be measured, using a magnetic circuit. However, shielding for highly sensitive sensors is very complex and expensive. Magnetic circuits are also expensive and, in addition, not only take up a great deal of mounting space but are difficult to assemble. A further disadvantage of magnetic circuits is the fact that they have a tendency to become saturated and thus introduce a certain non-linearity between the amperage and magnetic field strength into the measurement.

SUMMARY OF THE INVENTION

The device according to the present invention, the ammeter according to the present invention and the motor vehicle according to the present invention having the features of the subordinate claims have the advantage over the related art that the useful magnetic field measurement is impaired to a lesser degree by magnetic interference fields. This makes it possible to suppress the interference field. It is also possible to dispense with magnetic shielding, while simultaneously reducing the dependency on inhomogeneous interference fields.

This makes it possible to reduce or eliminate shielding measures, which results in a significant cost advantage.

It is further advantageous to provide a third sensor means, and for the first sensor means and the third sensor means to be provided in locations where the useful magnetic field is more or less uniform, at least in terms of actual amount. This enables a possible inaccuracy in the position of the main sensors to be detected and electrically compensated through suitable signal analysis, thus simplifying assembly and adjustment. This method may also be used to compensate the offset of the sensor means.

It is further advantageous to provide the second sensor means in the middle between the first and third sensor means. This makes it even easier to detect or compensate the positioning accuracy of the main sensors.

It is further advantageous to provide the conductor with a round cross-section. As a result, the magnetic field generated outside the conductor by the current flowing within the conductor is only slightly dependent on the frequency of the electrical current.

It is further advantageous to provide a magnetic field sensor, in particular, a Hall sensor, a lateral magnetotransistor or a magnetoresistive resistor as the sensor means. This makes it possible to easily and economically sense the current via the magnetic field generated by the current flow, sensor means provided in this manner also taking up less space.

DESCRIPTION OF THE EXEMPLARY EMBODIMENTS

Figure 1:
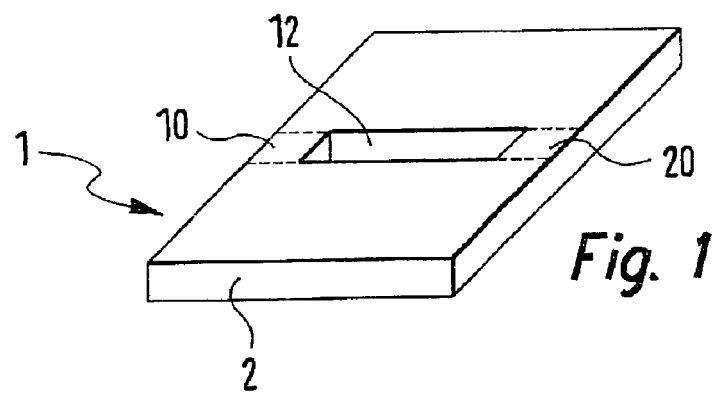
FIG. 1 shows a perspective representation of a first embodiment of a conductor arrangement.

FIG. 1 shows a perspective representation of a conductor arrangement 1, i.e., a conductor 1, according to a first embodiment. Conductor 1 has a cross-section 2 that is modified in the area of a slot 12. In the area of slot 12, the cross-section that determines the current flow is limited to only a first section 10 and a second section 20.

Figure 2:
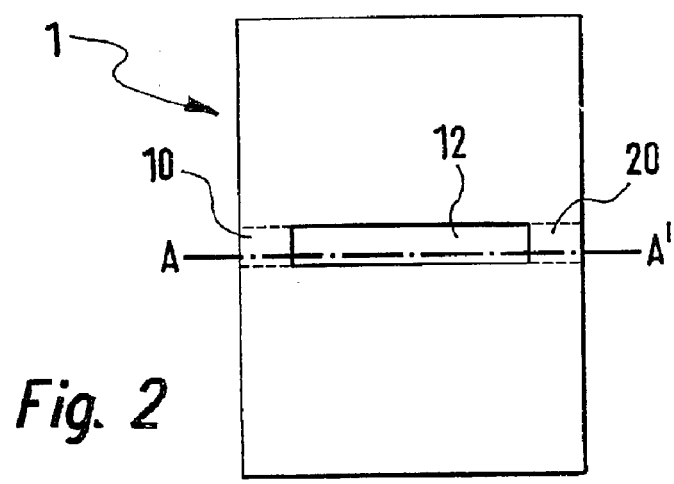
FIG. 2 shows a front view of the first embodiment of the conductor arrangement.

FIG. 2 shows a front view of conductor 1, first section 10 and second section 20 being represented again, as well as slot 12. A line of intersection A–A' is illustrated for conductor 1 in FIG. 2, line of intersection A–A' passing through the area of first and second sections 10, 20.

Figure 3:
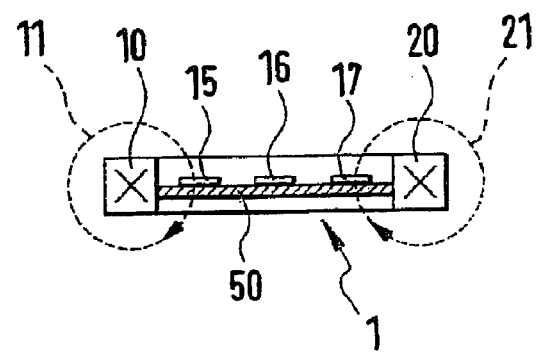
FIG. 3 shows the arrangement of the sensor means in the first embodiment of the conductor arrangement.

FIG. 3 shows the first embodiment of conductor 1 in the form of a cutaway view along line of intersection A–A' from FIG. 2. First section 10 and second section 20 are visible. First section 10 and second section 20 are marked by a cross within sections 10, 20, the purpose of which is to show that the direction of flow is into the plane of the drawing. This produces magnetic fields around first section 10 and second section 20, each of which is represented by a magnetic field line. Thus, a first magnetic field line 11 is drawn around first section 10, and a second magnetic field line 21 around second section 20. The variation of the respective magnetic fields around sections 10, 20 is illustrated only schematically in FIG. 3. A possible shape other than a round one for the magnetic field lines when the cross-section of conductor 1 is not round in the area of sections 10, 20 was not provided in FIG. 3. Both magnetic field lines 11, 21 are oriented in a clockwise direction.

FIG. 3 also shows a first sensor means 15, a second sensor means 16 and a third sensor means 17. First sensor means 15 and third sensor means 17 are arranged symmetrically relative to second sensor means 16. The three sensors means 15, 16, 17 are also provided more or less along a straight line. The magnetic fields generated around sections 10, 20 by the current flow yield a useful magnetic field by superimposition. Second sensor 16 is positioned so that the useful magnetic field disappears at its location. First sensor means 15 and third sensor means 17 are positioned so that, at their locations, the useful magnetic field is largely uniform in terms of actual amount. This makes it possible for second sensor means 16 to measure only a possible magnetic interference field, wile first sensor means 15 and third sensor means 17 each measure the useful magnetic field. A suitable evaluation of the signals of first and third sensor means 15, 17, as well as of second sensor means 16, makes it possible to suppress the magnetic interference field or exclude it from the calculation by subtracting the electrical measurement signals. First and second sensor means 15, 17 are also referred to as main sensors, while second sensor means 16 is also known as the secondary sensor. The difference between the useful signals of both main sensors 15, 17 may also be used to electronically compensate for any inaccuracies in the positions of these sensors 15, 17. An evaluation may also be used to electronically compensate for the fact that currents of different intensities flow in different sections 10, 20, due to manufacturing tolerances, in particular, different cross-sections. This makes conductor 1 easier and more economical to produce. To achieve this, for example, the operating points of the main sensors, which are provided, for example, in the form of lateral magnetotransistors, are adjusted for each of the main sensors so that each sensor has a different sensitivity, making it possible to compensate for the signal differences between both sensor elements 15, 17. This enables a much higher accuracy to be achieved.

The three or more sensors may also be provided on a single, slightly elongated ASIC. An analyzer circuit for sensor means 15, 16, 17 may also be provided, for example, on an ASIC.

The arrangement according to the present invention is also integrated into a housing, for example, by casting conductor 1 together with sensors 15, 16, 17 and the evaluation circuit, which is not illustrated, using a casting compound. In this case, only the signal lines for controlling and analyzing the analysis electronics and the lines leading to and from conductor 1 extend from a component, i.e., ammeter, of this type.

According to the present invention, a housing of this type is provided, in particular, to contain magnetically active substances that have a further shielding effect for magnetic interference fields. The use of an ammeter of this type in a motor vehicle provides an especially economical, simple and space-saving way to different currents within a wide range of magnitudes despite the strong electromagnetic interference field that is present in and around a motor vehicle.

Figure 4:
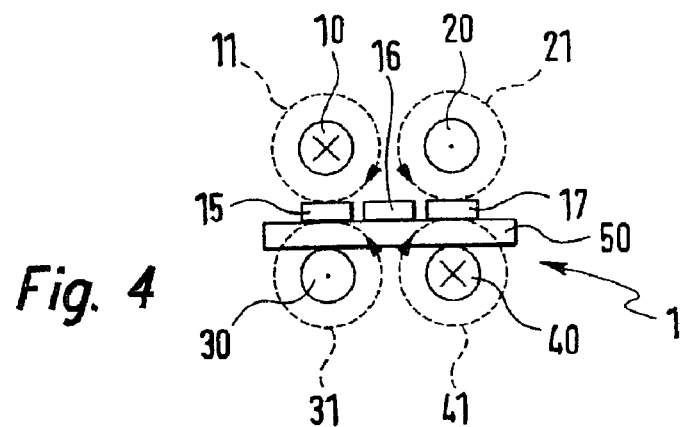
FIG. 4 shows the arrangement of the sensor means in a second embodiment of the conductor arrangement.

FIG. 4 shows a second embodiment of a conductor 1 in which the sensor arrangement according to the present invention is implemented. In this case, not only a first section 10 and a second section 20, but also a third section 30 and a fourth section 40 of conductor 1 are provided. First, second, third and fourth sections 10, 20, 30, 40 are provided, in particular, in the form of straight conductor elements that run parallel to each other and whose center points are more or less on the same plane relative to their longitudinal axes. FIG. 4 shows a cross-section of such a second embodiment of conductor 1 on a plane that lies perpendicular to sections 10, 20, 30, 40. For this purpose, a first flow direction is defined by the flow direction in first section 10 and in fourth section 40; a second flow direction is defined by the flow direction in second section 20 and in third section 30; and the first flow direction and the second flow direction have an antiparallel orientation. In addition, the center points, i.e., centers, of the sections on the cross-sectional plane essentially form a rectangle or square. The corresponding center point of first section 10 and the corresponding center point of fourth section 40 are positioned diagonally to each other. First sensor means 15 is provided between first section 10 and third section 30; third sensor means 17 Is provided between second section 20 and fourth section 40, and second sensor means 16 is provided in the middle between first section 10, second section 20, third section 30, and fourth section 40, i.e., more or less in the center of the arrangement. A disappearing useful magnetic field is provided at the location of second sensor means 16. FIG. 4 further shows the local magnetic fields around sections 10, 20, 30, 40. A first representative magnetic field line 11, which is oriented in a clockwise direction, is shown around first section 10. This correlates to the fact that the flow direction in first section 10 is oriented into the plane of the drawing, which is represented by a cross within first section 10. A fourth magnetic field line 41, which is also oriented in a clockwise direction and also correlates to the fact that the flow direction in fourth section 4 is oriented into the plane of the drawing, which is represented by a cross within fourth section 40, is shown around fourth section 40. A second magnetic field line 21 is shown around section 20 and is oriented in a counter-clockwise direction to indicate that, in second section 20, the flow direction is oriented away from the plane of the drawing, which is represented by a dot in second section 20. A third magnetic field line 31, which is also oriented in a counter-clockwise direction, is shown around third section 30, a dot in third section 30 indicating that the flow direction in third section 30 is oriented away from the plane of the drawing. Sensor means 15, 16, 17 in FIG. 4 are mounted on a mounting plate 50, which is also the case in FIG. 3.

Figures 5, 6, 7:
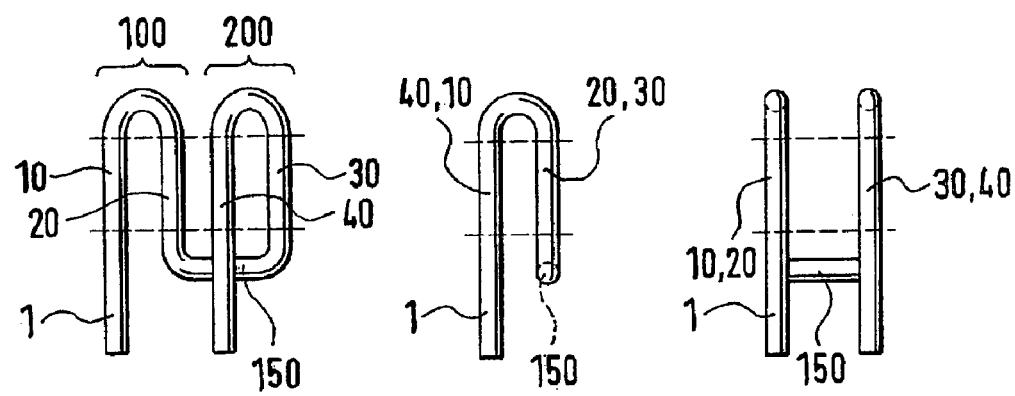
FIG. 5 shows a perspective representation of the second embodiment of the conductor arrangement.
FIG. 6 shows a side view of the second embodiment of the conductor arrangement.
FIG. 7 shows a front view of the second embodiment of the conductor arrangement.

FIGS. 5, 6 and 7 show different representations of the second embodiment of electrical conductor arrangement 1, i.e., electrical conductor 1. According to the present invention, conductor 1 includes first section 10, second section 20, third section 30 and fourth section 40. Conductor 1 also includes a first conductor area 100, which is largely in the shape of a horseshoe. First conductor area 100 includes first section 10 and second section 20. The horseshoe shape in first conductor area 100 is established as follows: First conductor area 100 includes not only first section 10 and second section 20, but also a connecting segment, which is provided more or less in the shape of a semicircle, at the ends of which first section 10 and second section 20 each form legs that continue the horseshoe shape formed by first conductor area 100. Likewise, third section 30, fourth section and an additional connecting segment of second conductor area 200 are provided in the shape of a horseshoe. The two conductor areas 100, 200 of electrical conductor 1 provide four ends of two horseshoe shapes, from which, according to the present invention, two ends of different conductor areas 100, 200 are connected by a connecting piece 150 so that both conductor areas 100, 200 are connected, the other two ends of the horseshoe shape formed by conductor areas 100, 200 serving to conduct electrical current to and from the arrangement. Connecting piece 150 is, in particular, also provided with a largely semicircular shape. According to the present invention, both conductor areas 100, 200 are, in particular, arranged side-by-side and oriented in the same direction. According to the present invention, a round cross-section is provided, in particular, as the conductor cross-section, although rectangular or square cross-sections are also conceivable in this case.

What is claimed is:

1. A device for measuring an electrical amperage in an electrical conductor, comprising:
   a first section of the conductor;
   a second section of the conductor;
   a first sensor element;
   a second sensor element; and
   a third sensor element, wherein:
      a current flows in the first section and in the second section to generate a magnetic field,
      the first sensor element measures the magnetic field,
      the second sensor element is situated in a location where the magnetic field disappears,
      the second sensor element measures a magnetic interference field,
      a measurement of the magnetic field is correctable using a measurement of the magnetic interference field, and
      the first sensor element and the third sensor element are situated in locations where the magnetic field is substantially uniform at least in terms of actual amount.

2. The device as recited in claim 1, wherein:
   the second sensor element is situated in the middle between the first sensor element and the third sensor element.

3. The device as recited in claim 1, wherein:
   the conductor includes a strip-type conductor.

4. The device as recited in claim 1, further comprising:
   a third section of the conductor; and
   a fourth section of the conductor are provided, wherein:
      the current flowing in the first section of the conductor, the second section of the conductor, the third section of the conductor, and the fourth section of the conductor generates the magnetic field.

5. The device as recited in claim 1, wherein:
   the conductor includes a round cross-section.

6. The device as recited in claim 1, wherein:
   each one of the first sensor element and the second sensor element includes a magnetic field sensor.

7. The device as recited in claim 6, wherein:
   the magnetic field sensor includes at least one of a Hall sensor, a lateral magnetotransistor, and a magnetoresistive resistor.

8. An ammeter, comprising:
   a device for measuring an electrical amperage in an electrical conductor, the device including:
      a first section of the conductor;
      a second section of the conductor;
      a first sensor element;
      a second sensor element; and
      a third sensor wherein:
         a current flows in the first section and in the second section to generate a magnetic field,
         the first sensor element measures the magnetic field,
         the second sensor element is situated in a location where the magnetic field disappears,
         the second sensor element measures a magnetic interference field,
         a measurement of the magnetic field is correctable using a measurement of the magnetic interference field, and
         the first sensor element and the third sensor element are situated in locations where the magnetic field is substantially uniform at least in terms of actual amount.

9. A motor vehicle, comprising:
   a device for measuring an electrical amperage in an electrical conductor, the device including:
      a first section of the conductor;
      a second section of the conductor;
      a first sensor element;
      a second sensor element; and
      a third sensor element, wherein:
         a current flows in the first section and in the second section to generate a magnetic field,
         the first sensor element measures the magnetic field,
         the second sensor element is situated in a location where the magnetic field disappears,
         the second sensor element measures a magnetic interference field, and
         a measurement of the magnetic field is correctable using a measurement of the magnetic interference field, and
         the first sensor element and the third sensor element are situated in locations where the magnetic field is substantially uniform at least in terms of actual amount.

* * * * *

UNITED STATES PATENT AND TRADEMARK OFFICE
CERTIFICATE OF CORRECTION

PATENT NO. : 6,940,265 B2 Page 1 of 1
APPLICATION NO. : 10/221008
DATED : September 6, 2005
INVENTOR(S) : Hauenstein et al.

It is certified that error appears in the above-identified patent and that said Letters Patent is hereby corrected as shown below:

Column 1, lines 51-52, delete "having the features of the subordinate claims";

Column 2, line 20, change "OF THE DRAWING" to --OF THE DRAWINGS--;

Column 2, lines 37-38, change "DESCRIPTION OF THE EXEMPLARY EMBODIMENTS" to --DETAILED DESCRIPTION-- and Column 6, line 37, change "interference field, and" to --interference field,--.

Signed and Sealed this

Twenty-first Day of November, 2006

JON W. DUDAS
*Director of the United States Patent and Trademark Office*